(12) United States Patent
Xiong

(10) Patent No.: US 7,710,123 B2
(45) Date of Patent: May 4, 2010

(54) VOLTAGE VARIANCE TESTER

(75) Inventor: Jin-Liang Xiong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 235 days.

(21) Appl. No.: 12/045,673

(22) Filed: Mar. 10, 2008

(65) Prior Publication Data

US 2009/0167318 A1 Jul. 2, 2009

(30) Foreign Application Priority Data

Dec. 28, 2007 (CN) .......................... 2007 1 0203527

(51) Int. Cl.
*H01H 31/02* (2006.01)
*G01R 31/02* (2006.01)
(52) U.S. Cl. .......................... 324/555; 324/72; 713/340
(58) Field of Classification Search ................. 324/555, 324/72; 713/300, 340
See application file for complete search history.

(56) References Cited

U.S. PATENT DOCUMENTS

| 7,216,241 B2 * | 5/2007 | Babb et al. .................. 713/300 |
| 7,312,614 B2 * | 12/2007 | Peng .......................... 324/538 |
| 2003/0001608 A1 * | 1/2003 | Thibeault .................... 324/765 |

* cited by examiner

*Primary Examiner*—Timothy J Dole
(74) *Attorney, Agent, or Firm*—Frank R. Niranjan

(57) ABSTRACT

An exemplary voltage variance tester includes a first to a third testing circuits each comprising an adjustable power source and an electrical switch; a first to a third signal generators providing a first to a third signals respectively; a connector having a first to a third terminals connected to the first to the third testing circuits respectively for receiving the adjustable power sources, a fourth to a sixth terminals connected to the first to the third signal generators for receiving the first to the third signals, and a seventh terminal; and a control circuit connected to the seventh terminal of the connector for receiving a power on signal to turn on the first to third electrical switch, wherein, voltage variances of the motherboard are tested by adjusting the first to the third adjustable power sources.

10 Claims, 6 Drawing Sheets

VOLTAGE VARIANCE TESTER

BACKGROUND

1. Field of the Invention

The present invention relates to testers, and particularly to a voltage variance tester.

2. Description of Related Art

A typical microprocessor-cored computer system, such as a personal computer or a workstation computer, is turned on and off by a switch device that mechanically connects/disconnects a power supply of the computer system to/from an external voltage source, such as AC 110V. The power supply is connected to the external voltage source and transforms the external voltage into a predetermined DC level, such as +3.3V, ±5V and ±12V, and the computer system is turned on to perform various programs and functions.

As known by a person skilled with computers, power supplies are typically either ATX power supply or BTX power supply. A motherboard of a computer can be coupled to the BTX power supply via a 24-pin BTX power connector. The BTX power supply provides +3.3V, ±5V, ±12V, +5V_STBY (stand by), PS-ON (power supply on) signal and PWROK (power ok/power good) signal to a motherboard of the computer. However, each type of power supply has a unique voltage variance/range centered about its rated output; therefore operators need to test a voltage variance of the motherboard corresponding to the power supply output to make sure the motherboard is compatible with that type of power supply.

What is needed, therefore, is a voltage variance tester which can test voltage variance of a motherboard.

SUMMARY

An exemplary voltage variance tester includes a first testing circuit comprising a first adjustable power source and a first electrical switch; a second testing circuit comprising a second adjustable power source and a second electrical switch; a third testing circuit comprising a third adjustable power source and a third electrical switch; a first signal generator connected to the third adjustable power source and providing a first signal; a second signal generator connected to the second testing circuit and the first signal generator to receive the second adjustable power source and the first signal and providing a second signal according to the second adjustable power source and the first signal; a third signal generator connected to the third testing circuit and providing a third signal; a connector arranged to connect to a power connector of a motherboard, the connector having a first to a third terminals connected to the first to third testing circuits respectively for receiving the adjustable power sources via the electrical switches, a fourth to a sixth terminals connected to the first to the third signal generators respectively for receiving the first to the third signals, and a seventh terminal; and a control circuit connected to the seventh terminal of the connector for receiving a power on signal to turn on the first to third electrical switch, wherein, voltage variances of the motherboard are tested by adjusting the first to the third adjustable power sources.

Other advantages and novel features of the present invention will become more apparent from the following detailed description of preferred embodiment when taken in conjunction with the accompanying drawings, in which:

DETAILED DESCRIPTION

Figure 1:
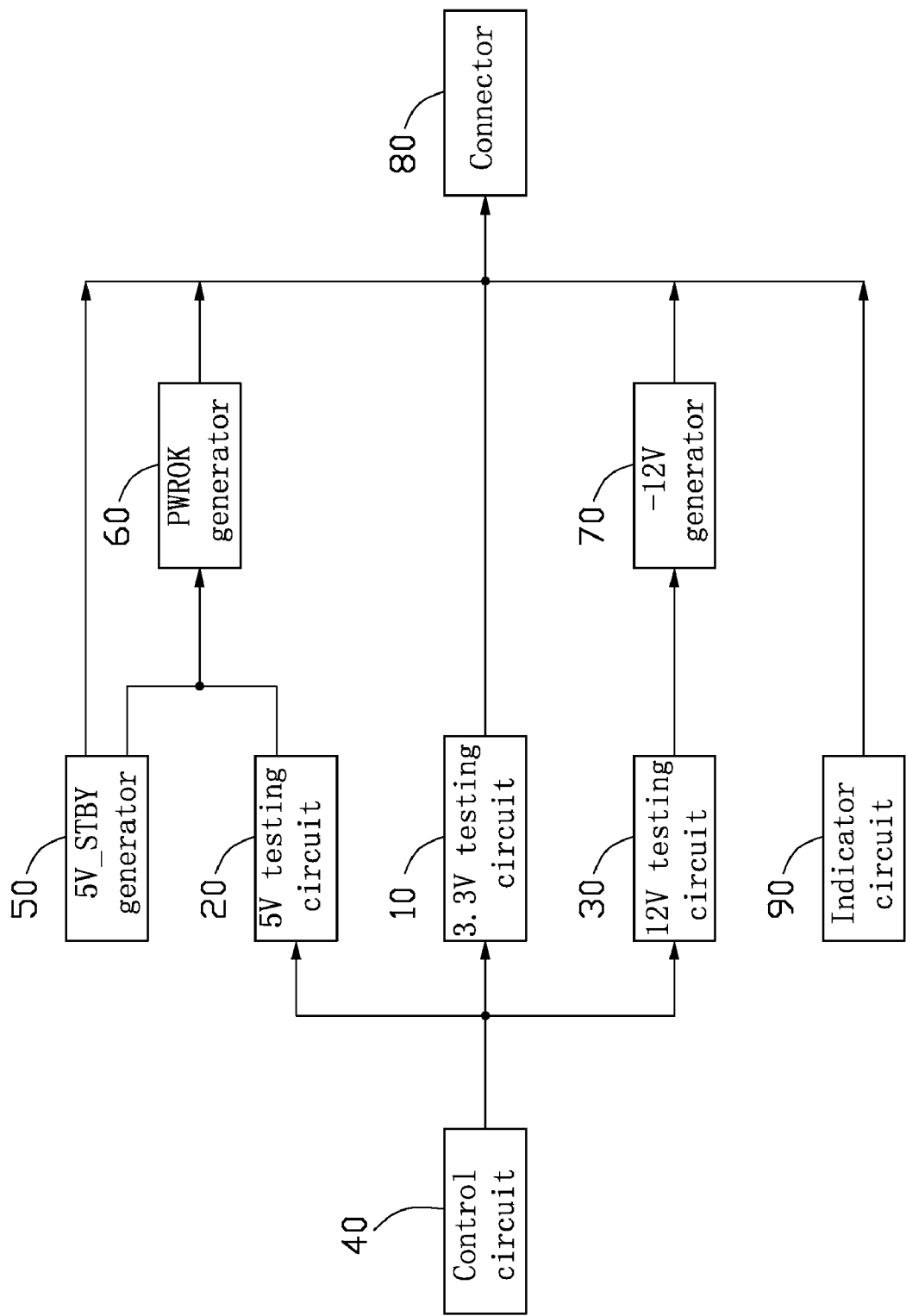
FIG. 1 is a circuit diagram of a voltage variance tester in accordance with an embodiment of the present invention comprising three testing circuits, a 5V_STBY generator, a PWROK generator, a −12V generator, and a connector.

Referring to FIG. 1, a voltage variance tester in accordance with an embodiment of the present invention includes a 3.3V testing circuit 10, a 5V testing circuit 20, a 12V testing circuit 30, a control circuit 40, a 5V_STBY generator 50 arranged to generate a 5V standby voltage, a PWROK generator 60 arranged to generate a power ok signal, a −12V generator 70 arranged to generate a −12V voltage, a connector 80, and an indicator circuit 90. In this embodiment of the invention, the connector 80 is a 24-pin BTX power connector.

Figure 2:
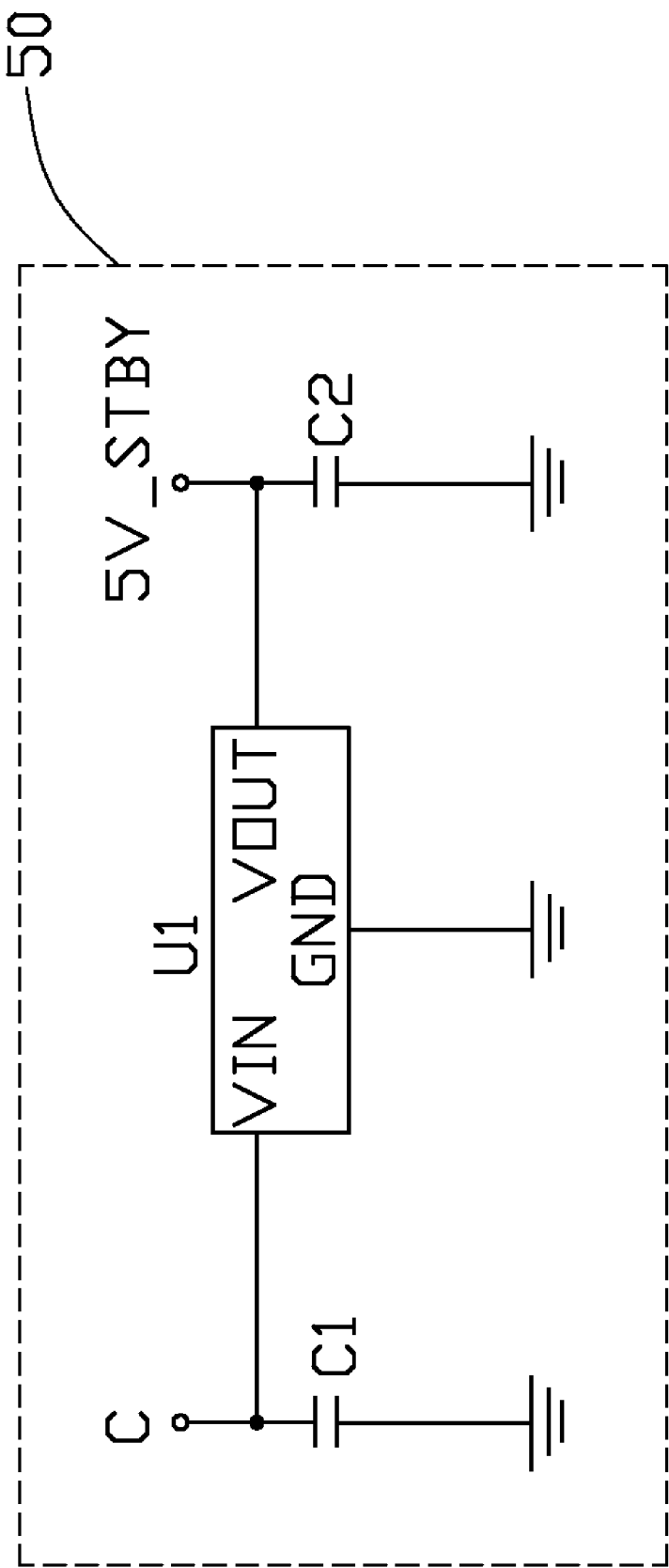
FIG. 2 is a circuit diagram of the 5V_STBY generator of FIG. 1.
Figure 6:
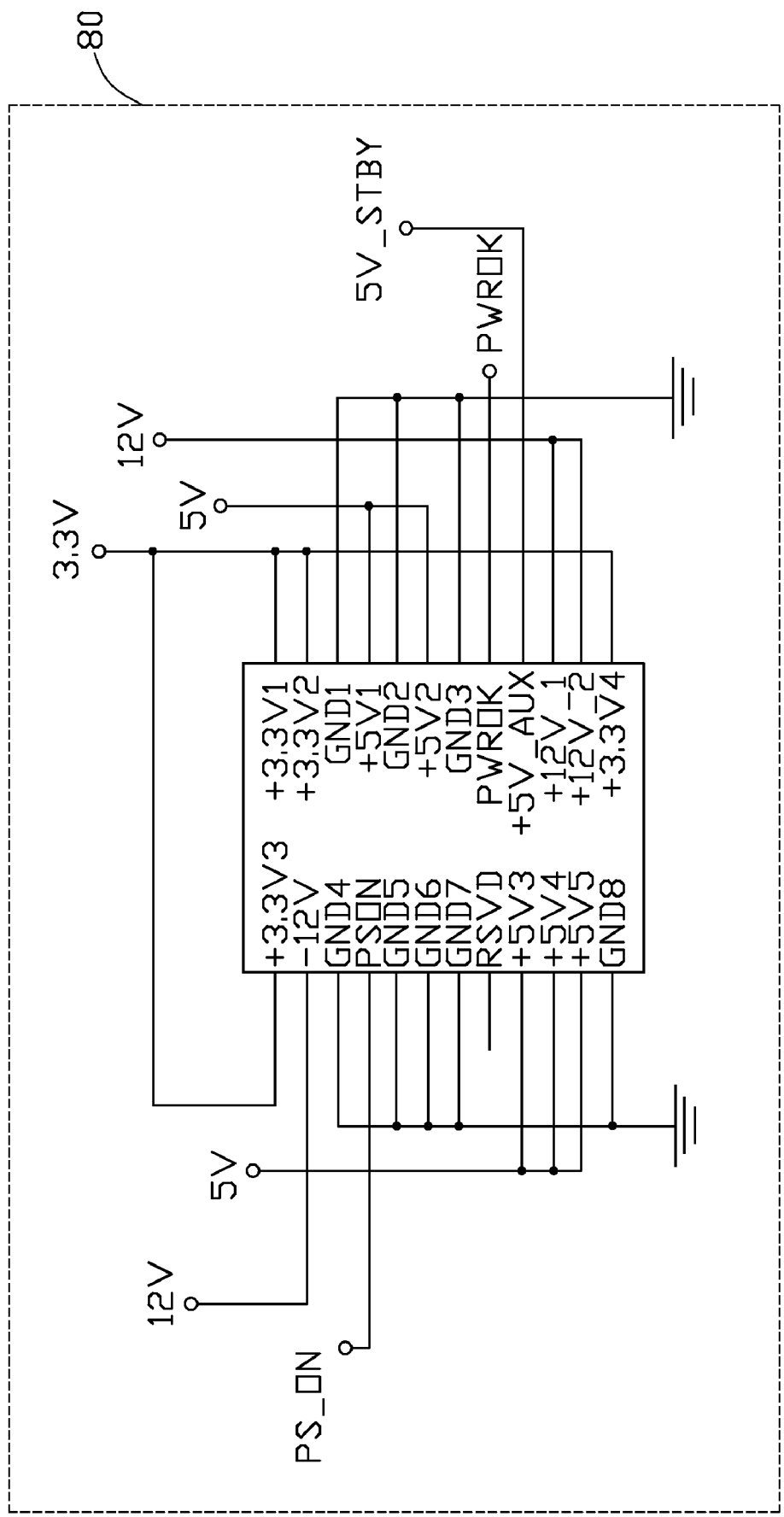
FIG. 6 is a circuit diagram of the connector of FIG. 1.

Referring to FIG. 2 and FIG. 6, the 5V_STBY generator 50 includes a voltage regulator U1 and two capacitors C1 and C2. The voltage regulator U1 is a 7805 voltage regulator with an input terminal VIN connected to an adjustable power source C and grounded via the capacitor C1, a ground terminal GND grounded, and an output terminal VOUT grounded via the capacitor C2 and connected to a +5V_AUX terminal of the connector 80 for providing a 5V voltage.

Figure 3:
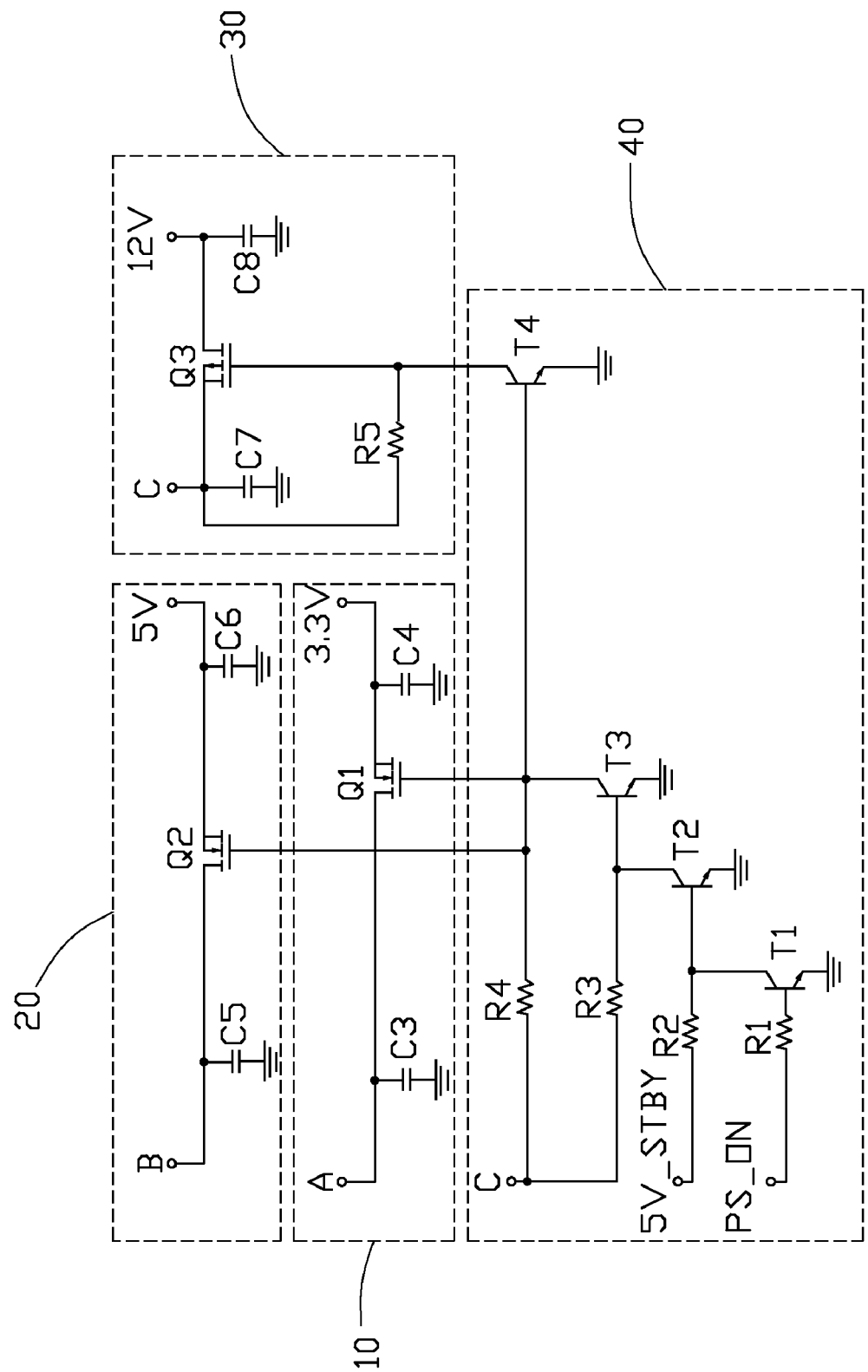
FIG. 3 is a circuit diagram of the testing circuits of FIG. 1.

Referring to FIG. 3 and FIG. 6, the 3.3V testing circuit 10 includes an adjustable power source A, an NMOS transistor Q1 functioning as an electrical switch, and two capacitors C3 and C4. The drain of the NMOS transistor Q1 is connected to the adjustable power source A and grounded via the capacitor C3, and the source of the NMOS transistor Q2 is connected to a 3.3V terminal of the connector 80 and grounded via the capacitor C4.

The 5V testing circuit 20 includes an adjustable power source B, an NMOS transistor Q2 functioning as an electrical switch, and two capacitors C5 and C6. The drain of the NMOS transistor Q2 is connected to the adjustable power source B and grounded via the capacitor C5, and the source of the NMOS transistor Q2 is connected to a +5V terminal of the connector 80 and grounded via the capacitor C6.

The 12V testing circuit 30 includes a PMOS transistor Q3 functioning as an electrical switch, two capacitors C7 and C8, and a resistor R5. The drain of the PMOS transistor Q3 is connected to a +12V terminal of the connector 80 and grounded via the capacitor C8, the source of the PMOS transistor Q3 is connected to the adjustable power source C and grounded via the capacitor C7, and the gate of the PMOS transistor Q3 is connected to the adjustable power source C via the resistor R5.

The control circuit 40 includes four transistors T1~T4 and four resistors R1~R4. The base of the transistor T1 is connected to a PS_ON terminal of the connector 80 via the resistor R1, and the collector of the transistor T1 is connected to the base of the transistor T2. The base of the transistor T2 is connected to the output terminal VOUT of the voltage regulator U1 of the 5V_STBY generator 50 via the resistor R2, and the collector of the transistor T2 is connected to the base of the transistor T3. The base of the transistor T3 is connected to the adjustable power source C via the resistor R3, and the collector of the transistor T3 is connected to the gates of the NMOS transistors Q1 and Q2. The gate of the transistor T4 is connected to the collector of the transistor T3 and to the adjustable power source C via the resistor R4, and the collector of the transistor T4 is connected to the gate of the PMOS transistor Q3. The source of the transistors T1~T4 are grounded.

Figure 4:
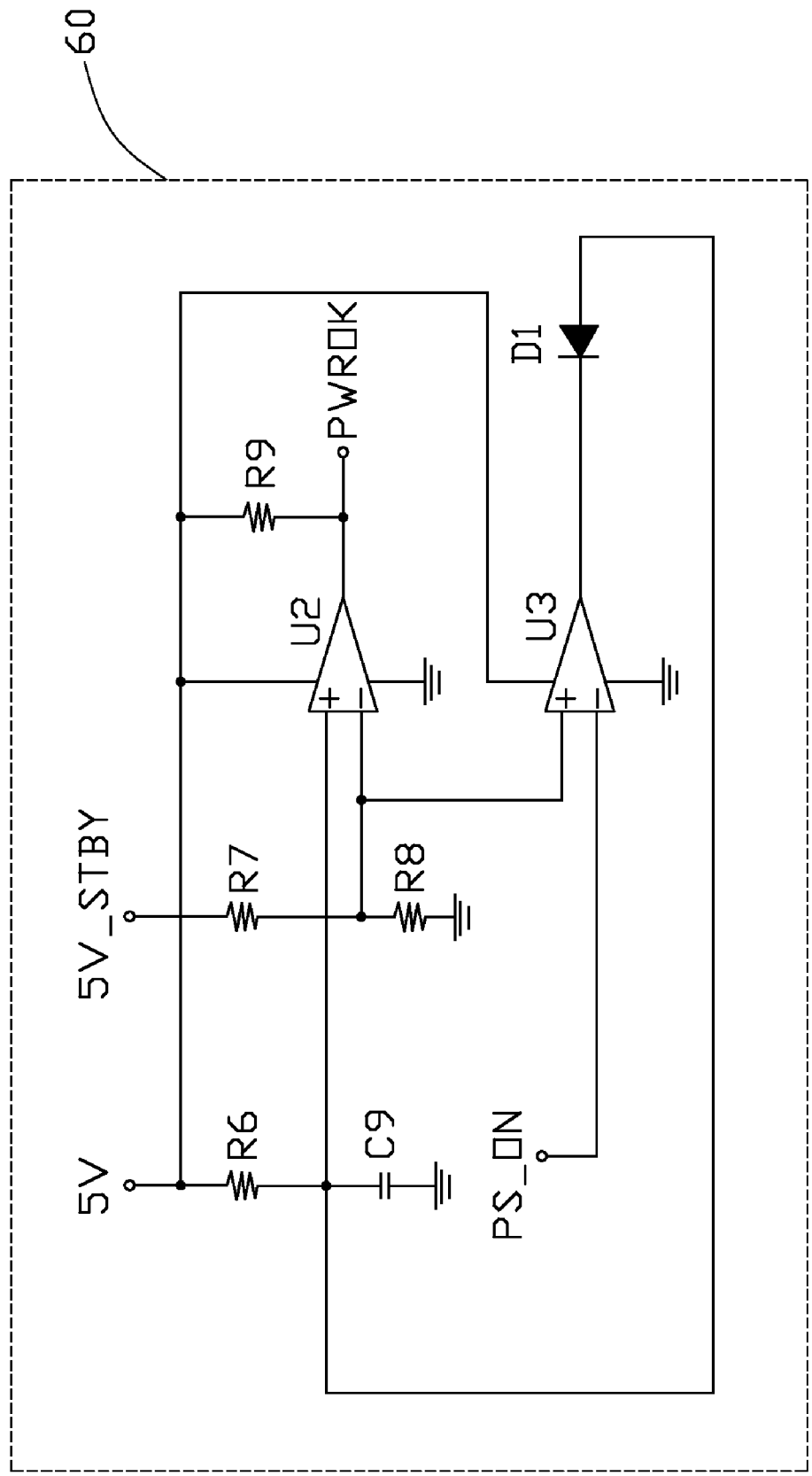
FIG. 4 is a circuit diagram of the PWROK generator of FIG. 1.

Referring to FIG. 4 and FIG. 6, the PWROK generator 60 includes two comparators U2 and U3, four resistors R6~R9, a capacitor C9, and a diode D1. The non-inverting input terminal of the comparator U2 is connected to the source of the NMOS transistor Q2 of the 5V testing circuit 20 via the resistor R6 and grounded via the capacitor C9. The inverting input terminal of the comparator U2 is connected to the output terminal VOUT of the voltage regulator U1 of the 5V_STBY generator 50 via the resistor R7 and grounded via the resistor R8. The output terminal of the comparator U2 is connected to a PWROK terminal of the connector 80 and connected to the source of the NMOS transistor Q2 of the 5V testing circuit 20 via the resistor R9. The non-inverting input terminal of the comparator U3 is connected to the inverting input terminal of the comparator U2, the inverting input terminal of the comparator U3 is connected to the PS_ON terminal of the connector 80, and the output terminal of the comparator U3 is connected to the cathode of the diode D1. The anode of the diode D1 is connected to the non-inverting input terminal of the comparator U2.

Figure 5:
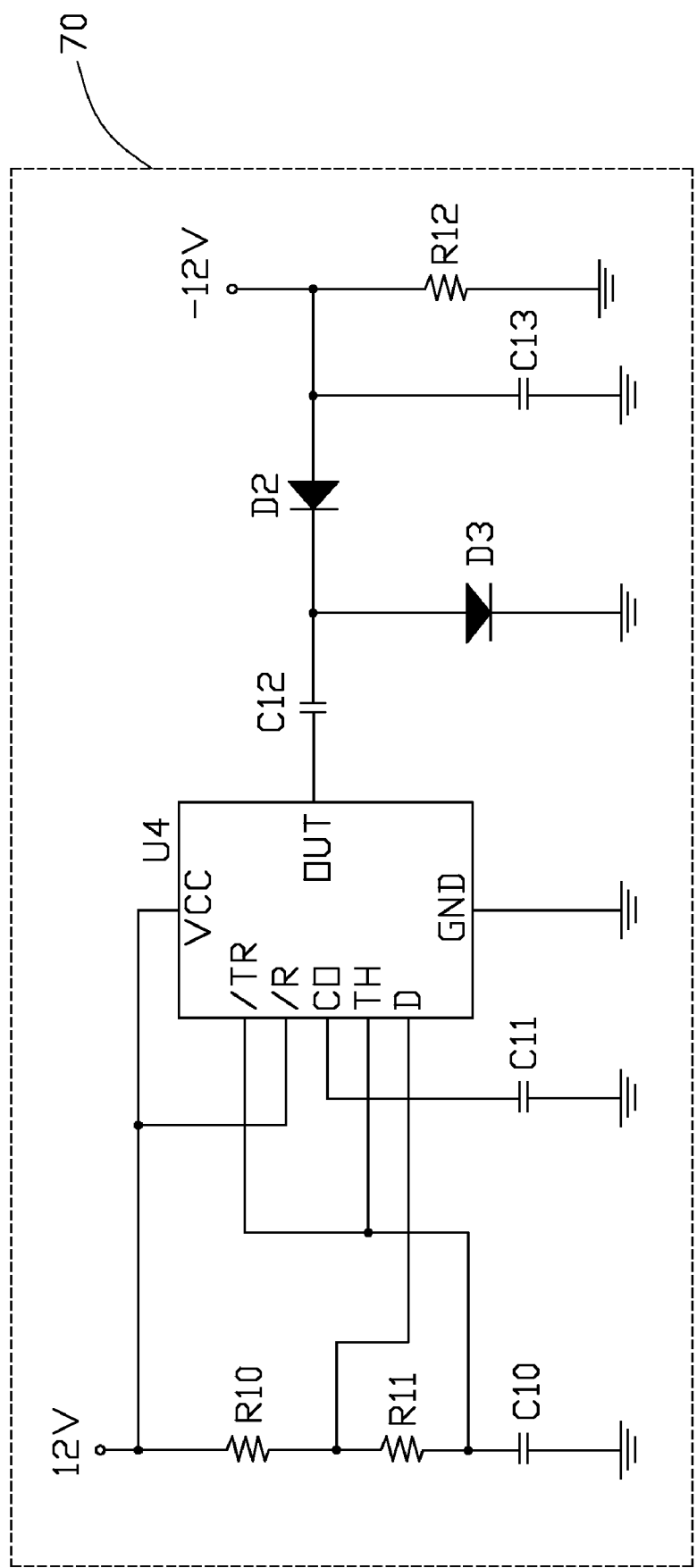
FIG. 5 is a circuit diagram of the −12V generator of FIG. 1.

Referring to FIG. 5 and FIG. 6, the −12V generator 70 includes a timer U4, three resistors R10~R12, four capacitors C10~C13, and two diodes D2 and D3. The timer U4 includes a power terminal VCC, a ground terminal GND, a reset terminal /R, a trigger terminal /TR, a control terminal CO, a threshold voltage terminal TH, a discharging terminal D, and an output terminal OUT. The power terminal VCC and the reset terminal /R of the timer U4 are connected to the drain of the PMOS transistor Q3 and grounded via the resistors R10~R11 and the capacitor C10 in turn, the ground terminal GND is grounded, the trigger terminal /TR and threshold voltage terminal TH are grounded via the capacitor C10, the discharging terminal D is connected to a node between the resistors R10 and R11, the control terminal CO is grounded via the capacitor C11, and the output terminal is connected to the anode of the diode D3 via the capacitor C12 and to the cathode of the diode D2 via the capacitor C12. The cathode of the diode D3 is grounded, and the anode of the diode D2 is connected to a −12V terminal of the connector 80 and grounded via the capacitor 13 and resistor R12 connected in parallel.

In this embodiment of the invention, the connector 80 is coupled to a corresponding connector of a motherboard, the adjustable power sources A~C provide 3.3V, 5V, and 12V voltages to the motherboard respectively, and the 5V_STBY generator 50 provides the 5V voltage as a 5V_STBY power source. When the motherboard is turned on, the PS_ON terminal of the connector 80 is at a low level, therefore the transistor T1 is turned off, the transistor T2 is turned on, the transistor T3 is turned off, and the transistor T4 is turn. The NMOS transistors Q1~Q2 and the PMOS transistor Q3 are turned on.

In the PWROK generator 60, the capacitor C9 is charged by the 5V_STBY generator 50 to make the output terminal of the comparator U2 at a high level when a voltage on the capacitor C9 is higher than a voltage on the resistor R8, therefore the PWROK terminal of the connector 80 is at a high level.

In the −12V generator 70, the capacitor C10 is charged by the 12V testing circuit 30. When voltage across the capacitor C10 rises to 4V, the timer U4 is triggered to output a 12V voltage charging the capacitor C12. When the voltage across the capacitor C10 rises to 8V, the timer U4 is reset to stop outputting and the capacitor C10 is discharged. At this time, the voltage across the capacitor C12 is 12V providing a −12V to the motherboard.

Therefore, when the motherboard is turned on, the voltage variance tester is turned on to provide 3.3V, 5V, 12V, and −12V voltages to the motherboard and functions as a computer power supply. Then, operators can adjust the adjustable power sources A~C to test voltage variances of the motherboard. For example, if the motherboard turns off when the adjustable power source A is set lower than 2.67V or higher than 3.63V, then voltage variance is 2.67-3.63V for the 3.3V input. The indicator circuit 90 is provided to show whether the voltage variance tester is turned on or off.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A voltage variance tester comprising:
   a first testing circuit comprising a first adjustable power source and a first electrical switch;
   a second testing circuit comprising a second adjustable power source and a second electrical switch;
   a third testing circuit comprising a third adjustable power source and a third electrical switch;
   a first signal generator connected to the third adjustable power source and providing a first signal;
   a second signal generator connected to the second testing circuit and the first signal generator to receive the second adjustable power source and the first signal and providing a second signal according to the second adjustable power source and the first signal;
   a third signal generator connected to the third testing circuit and providing a third signal;
   a connector arranged to connect to a power connector of a motherboard, the connector having a first to a third terminals connected to the first to third testing circuits respectively for receiving the adjustable power sources via the electrical switches, a fourth to a sixth terminals connected to the first to the third signal generators respectively for receiving the first to the third signals, and a seventh terminal; and
   a control circuit connected to the seventh terminal of the connector for receiving a power on signal to turn on the first to third electrical switches,
   wherein, voltage variances of the motherboard are tested by adjusting the first to the third adjustable power sources.

2. The voltage variance tester as claimed in claim 1, wherein the control circuit comprising:
   a first bipolar junction transistor with the base connected to the seventh terminal of the connector, the emitter grounded;
   a second bipolar junction transistor with the base connected to the collector of the first transistor and the fourth terminal of the connector, the emitter grounded;

a third bipolar junction transistor with the base connected to the collector of the second transistor and the third adjustable power source, the collector connected to the first and the second electrical switches, and the emitter grounded; and a fourth bipolar junction transistor with the base connected to the collector of the third transistor and the third adjustable power emitter, the collector connected to the third electrical switch, and the source grounded.

3. The voltage variance tester as claimed in claim 2, wherein the first electrical switch is an NMOS transistor with the gate connected to the collector of the third transistor, the drain connected to the first adjustable power source, and the source connected to the first terminal of the connector; the second electrical switch is an NMOS transistor with the gate connected to the collector of the third transistor, the drain connected to the second adjustable power source, and the source connected to the second terminal of the connector; the third electrical switch is a PMOS transistor with the gate connected to the collector of the fourth transistor, the source connected to the third adjustable power source and the drain connected to the third terminal of the connector.

4. The voltage variance tester as claimed in claim 1, wherein the first signal generator comprises a voltage regulator connected between the third adjustable power source and the fourth terminal of the connector.

5. The voltage variance tester as claimed in claim 1, wherein the second signal generator comprises:

a first comparator with the non-inverting input terminal connected to the second terminal of the connector via a first resistor and the anode of a first diode, the inverting input terminal connected to the fourth terminal of the connector via a second resistor and grounded via a third resistor, and the output terminal connected to the second and the fifth terminals of the connector; and a second comparator with the non-inverting input terminal connected to the inverting input terminal of the first comparator, the inverting input terminal connected to the seventh terminal of the connector, and the output terminal connected to the cathode of the first diode.

6. The voltage variance tester as claimed in claim 1, wherein the third signal generator comprises a timer having a power terminal connected to the third terminal of the connector and grounded via a first resistor, a second resistor, and a first capacitor in turn, a reset terminal connected to the power terminal thereof, a control terminal grounded, a trigger terminal connected to a node between the second resistor and the first capacitor, a threshold voltage terminal connected to the trigger terminal thereof, an output terminal connected to the cathode of a first diode and the anode of a second diode via a second capacitor, the anode of the first diode is connected to the sixth terminal of the connector and ground via a third capacitor, and the cathode of the second diode grounded.

7. The voltage variance tester as claimed in claim 1, wherein the first testing circuit is arranged to test a 3.3V voltage variance, the second testing circuit is arranged to test a 5V voltage variance, the third testing circuit is arranged to test a 12V voltage variance.

8. The voltage variance tester as claimed in claim 7, wherein the first signal generator is arranged to provide a 5V voltage, the second signal generator is arranged to provide a power ok signal, and the third signal generator is arranged to provide a −12V voltage.

9. The voltage variance tester as claimed in claim 8, wherein the connector is a 24-pin power connector, and the first to seventh terminal of the connector are 3.3V terminal, 5V terminal, 12V terminal, +5V_AUX terminal, −12V terminal power ok terminal, and power supply on terminal.

10. The voltage variance tester as claimed in claim 1, wherein the voltage variance tester further comprises a indicator to show whether the voltage variance tester is turned on or off.

* * * * *